US005739046A

United States Patent [19]
Lur et al.

[11] Patent Number: 5,739,046
[45] Date of Patent: Apr. 14, 1998

[54] METHOD OF MAKING A RELIABLE BARRIER LAYER

[75] Inventors: Water Lur, Taipei; Shih-Chanh Chang, Taichung; Jiun Yuan Wu, Don-Lio; Der Yuan Wu, Hsin-Chu, all of Taiwan

[73] Assignee: United Microelectronics Corporation, Hsin-Chu, Taiwan

[21] Appl. No.: 657,058

[22] Filed: May 28, 1996

Related U.S. Application Data

[63] Continuation of Ser. No. 316,092, Sep. 30, 1994, abandoned.

[51] Int. Cl.⁶ .................................................. H01L 21/44
[52] U.S. Cl. .......................... 437/190; 437/192; 437/200
[58] Field of Search .................................. 437/190, 192, 437/200

[56] References Cited

U.S. PATENT DOCUMENTS

| | | | |
|---|---|---|---|
| 4,804,636 | 2/1989 | Groover, III et al. | 437/52 |
| 5,164,333 | 11/1992 | Schwalke et al. | 437/190 |
| 5,175,126 | 12/1992 | Ho et al. | 437/190 |
| 5,207,868 | 5/1993 | Shinohara | 156/656 |
| 5,242,860 | 9/1993 | Nulman et al. | 437/190 |
| 5,326,724 | 7/1994 | Wei | 437/190 |
| 5,391,519 | 2/1995 | Lur et al. | 437/190 |
| 5,395,795 | 3/1995 | Hong et al. | 437/190 |
| 5,395,798 | 3/1995 | Havemann | 437/190 |

OTHER PUBLICATIONS

"A Study of Electrical, Metallurgical, and Mechanical Behaviors of Rapid Thermal Processed Ti Film in NH3", by Farahani et al in J. Electrochem. Soc., vol. 141, No. 2, Feb. 1994, pp. 479–496.
Wolf et al., vol. III, Silicon Processing for the VLSI Era, Lattice Press, 1990.

*Primary Examiner*—Charles L. Bowers, Jr.
*Assistant Examiner*—Lynne A. Gurley
*Attorney, Agent, or Firm*—William H. Wright

[57] ABSTRACT

A new method of forming a metal diffusion barrier layer is described. Semiconductor device structures are formed in and on a semiconductor substrate. At least one dielectric layer covers the semiconductor structures and at least one contact hole has been opened through the dielectric layer(s) to the semiconductor substrate. A metal diffusion barrier layer is now formed using the following steps: In the first step, a thin layer of titanium is deposited conformally over the surface of the dielectric layer(s) and within the contact opening(s) and annealed in a nitrogen atmosphere at a temperature of between about 580° to 630° C. for between about 20 to 120 seconds. The second step is to form stable and adhesive titanium compounds on the pre-metal dielectric layer as well as to form a low resistance silicide on the contact silicon by annealing at between about 800° to 900° C. for between about 5 to 60 seconds. The final step is to release the system stress by tempering the layer at a temperature of between about 600° to 750° C. This completes the barrier layer which has good adhesion to the dielectric layer(s) and, therefore, promotes improved pad bonding yield.

41 Claims, 2 Drawing Sheets

METHOD OF MAKING A RELIABLE BARRIER LAYER

This is a continuation of application Ser. No. 08/316,092 filed on Sep. 30, 1994, now abandoned.

BACKGROUND OF THE INVENTION

(1) Field of the Invention

The invention relates to a method of forming a metal diffusion barrier layer in the fabrication of integrated circuits, and more particularly, to a method of forming a metal diffusion barrier layer with improved pad bonding yield and reduced junction leakage in the manufacture of integrated circuits.

(2) Description of the Prior Art

The formation of a conventional diffusion barrier layer between aluminum and silicon is completed by titanium or titanium/titanium nitride deposition followed by rapid thermal anneal (RTA) in $NH_3$ or $N_2$ to form titanium disilicide/ titanium oxynitride on metal contact regions. Metal bond pads are usually peeled during bonding because the compounds formed between titanium and the pre-metal dielectric are not good glue layers. Getting rid of the compounds on the pads before metal deposition causes particle problems and process complexity.

The typical RTA for the formation of a metal diffusion barrier layer is conducted by a two-step treatment; for example, annealing at 600° C. for 30 to 60 seconds followed by annealing at 700° to 900° C. for 10 to 30 seconds. Too low a temperature at the second step will result in bad pad bonding yield because some titanium compounds, such as $TiO_x$, cannot provide good adhesion between the metal and the pre-metal dielectric layer. On the other hand, if the temperature of the second step is too high, such as 800° to 900° C., a tremendous stress is generated in the contact regions and the conglomeration of silicide always causes unacceptable junction leakage making it impossible to fabricate low-power devices.

U.S. Pat. No. 5,207,868 to Shinohara describes a TiON/Ti barrier layer for Aluminum. "A Study of Electrical, Metallurgical, and Mechanical Behaviors of Rapid Thermal Processed Ti Film in NH3" by Farahani et al in J. Electrochem. Soc., Vol. 141, No. 2, February 1994, pp. 479–496, studies titanium nitride film formation.

SUMMARY OF THE INVENTION

A principal object of the present invention is to provide an effective and very manufacturable method of forming a metal diffusion barrier layer with improved pad bonding yield and reduced junction leakage.

In accordance with the objects of this invention a new method of forming a metal diffusion barrier layer is achieved. Semiconductor device structures are formed in and on a semiconductor substrate. A dielectric layer covers the semiconductor structures and a contact hole has been opened through the dielectric layer to the semiconductor substrate. A metal diffusion barrier layer is now formed using the following steps: In the first step, a thin layer of titanium is deposited conformally over the surface of the dielectric layer and within the contact opening and annealed in a nitrogen atmosphere at a temperature of between about 580° to 630° C. for between about 20 to 120 seconds. The second step is to form stable and adhesive titanium compounds on the pre-metal dielectric layer as well as to form a low resistance silicide on the contact silicon by annealing at between about 800° to 900° C. for between about 5 to 60 seconds. The final step is to release the system stress by tempering the layer at a temperature of between about 600° to 750° C. This completes the barrier layer which has good adhesion to the dielectric layer and, therefore, promotes improved pad bonding yield.

BRIEF DESCRIPTION OF THE DRAWINGS

In the accompanying drawings forming a material part of this description, there is shown.

DESCRIPTION OF THE PREFERRED EMBODIMENTS

Figure 1:
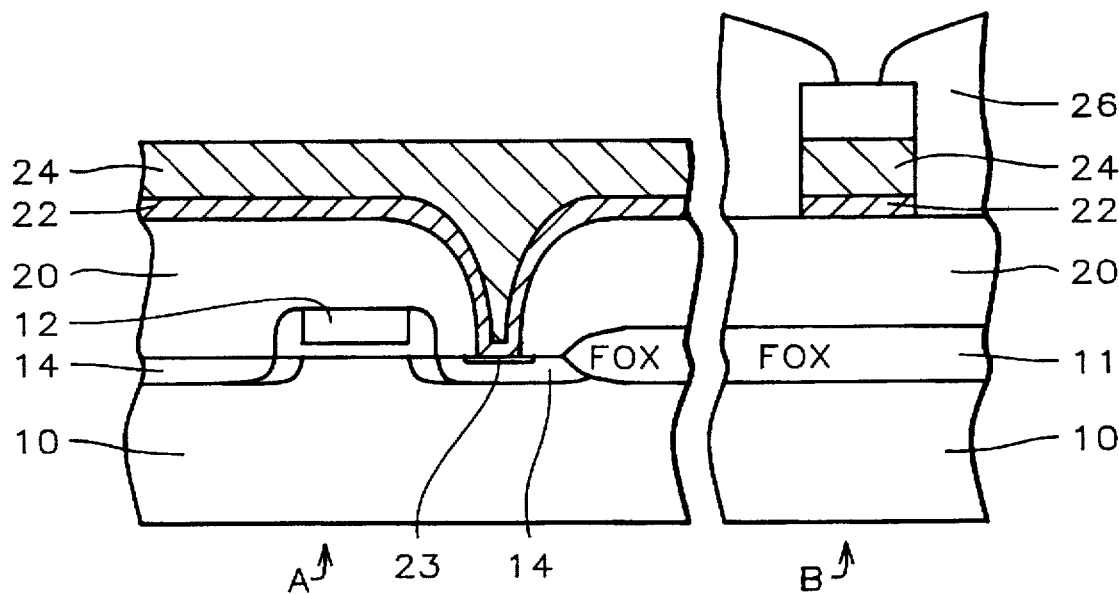
FIG. 1 schematically illustrates in cross-sectional representation a preferred embodiment of the present invention.

Referring now more particularly to FIG. 1, there is illustrated a portion of a partially completed integrated circuit. There is shown a semiconductor substrate 10, preferably composed of monocrystalline silicon. Active device region A and bonding region B are illustrated. Field OXide (FOX) regions 11 are formed as is conventional in the art. Semiconductor device structures such as gate electrodes 12 and source/drain regions 14 are formed as is understood in the art.

A pre-metal dielectric layer 20, composed of borophosphosilicate glass (BPSG), phosphosilicate glass (PSG), or silicon dioxide is deposited over the surface of the semiconductor device structures to a thickness of between about 3000 to 10,000 Angstroms. Contact holes are opened through the dielectric layer to the source/drain region 14 within the semiconductor substrate. Now the metal diffusion barrier layer of the present invention is to be formed.

The first step is to form the thickest possible titanium nitride film on the contact regions. A layer of titanium is deposited conformally over the surface of the dielectric layer 20 and within the contact openings by chemical vapor deposition or physical vapor deposition to a thickness of between about 200 to 2000 Angstroms. The titanium layer is annealed by Rapid Thermal Anneal (RTA) in a nitrogen ambient ($N_2$ or $NH_3$) at a temperature of between about 580° to 630° C. for between about 20 to 120 seconds to form titanium nitride layer 22. A $NH_3$ ambient is preferred because it produces a thicker titanium nitride layer. Regardless of the thickness of the deposited titanium layer, the thickness of the resulting titanium nitride layer is less than about 150 Angstroms.

As a result of this first annealing step, $Ti_5Si_3$, TiSi, and some $C49-TiSi_2$ are formed beneath the $TiN_xO_y$ titanium nitride layer.

As an alternative to depositing a titanium film and annealing to form titanium nitride, a sequential deposition of titanium followed by titanium nitride also works. The titanium should be deposited to between about 50 to 1000 Angstroms. The titanium nitride can be deposited in a commercial sputter using reactive sputtering or by chemical vapor deposition to a thickness of between about 200 to 2000 Angstroms.

The second step is to form stable and adhesive titanium compounds on the pre-metal dielectric layer as well as to form a low resistance silicide on the contact silicon. $TiO_x$ and $TiN_xO_y$ are formed if the annealing temperature is lower than about 750° C. If the temperature is greater than about 750° C., $TiSi_xO_y$ and $TiN_xO_y$ are formed instead. A titanium silicide compound ($TiSi_2$) 23 is formed within the silicon substrate in the contact opening.

The optimized annealing conditions are 800° to 900° C. for between about 5 to 60 seconds. Too low a temperature will result in the formation of compounds, such as $TiO_x$, that cannot provide good adhesion between the metal and pre-metal dielectric layers. Too high a temperature will result in the formation of stress defects between the $TiSi_2$ and the $TiN_xO_y$, and junction degradation which produces junction leakage. This would make a low power circuit non-operative. Also, the $TiSi_2$ will tend to grow into large grain size, especially if the temperature is over 900° C., which may cause spiking.

After this second annealing step, only C54-$TiSi_2$ exists under the $TiN_xO_y$ layer. Both C49-$TiSi_2$ and C54-$TiSi_2$ are silicon rich titanium silicides. C54-$TiSi_2$ is more stable at high temperatures and has a smaller resistivity than C49-$TiSi_2$ (about one-third).

Figure 2:
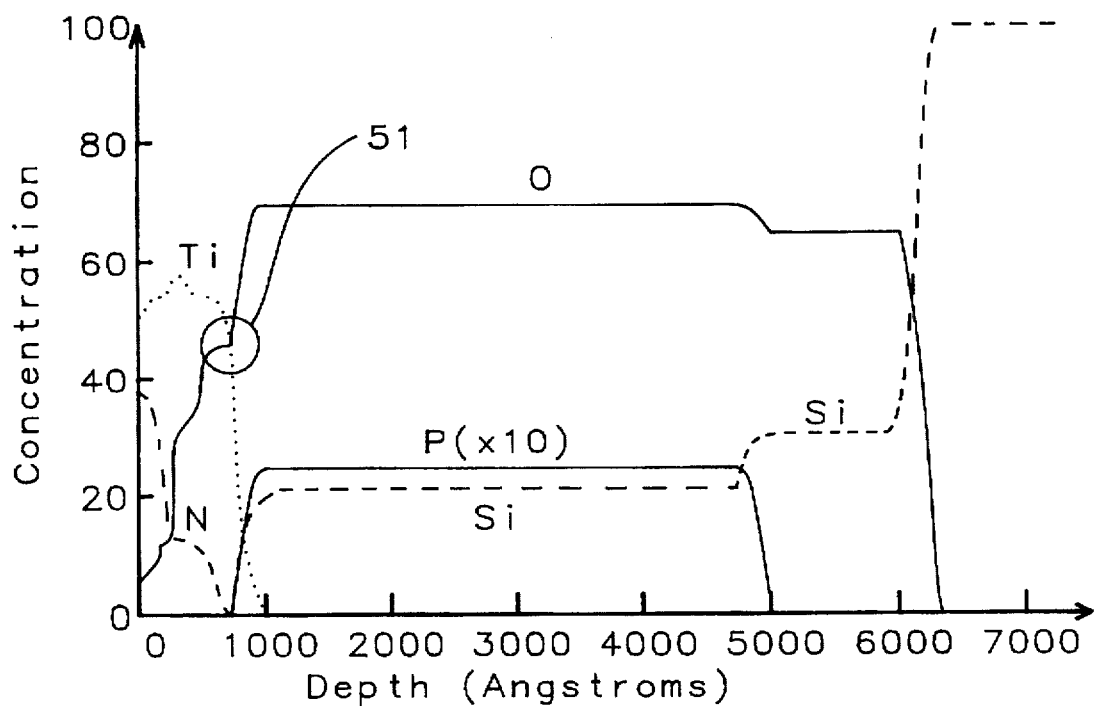
FIG. 2 graphically illustrates depth versus concentration of the elements of the barrier layer of the prior art.

Referring now to FIG. 2, there is illustrated Rutherford Backscattering Spectroscope data showing the depth versus concentration of the elements of the barrier layer for the prior art. A conventional recipe was used in which 500 Angstroms of titanium were sputtered onto a layer of BPSG, then RTA at 600° C. for 60 seconds, then at 750° C. for 20 seconds both in a $NH_3$ ambient. It can be seen that $TiO_x$, 51, is formed. This compound provides poor adhesion between metal and dielectric.

Figure 3:
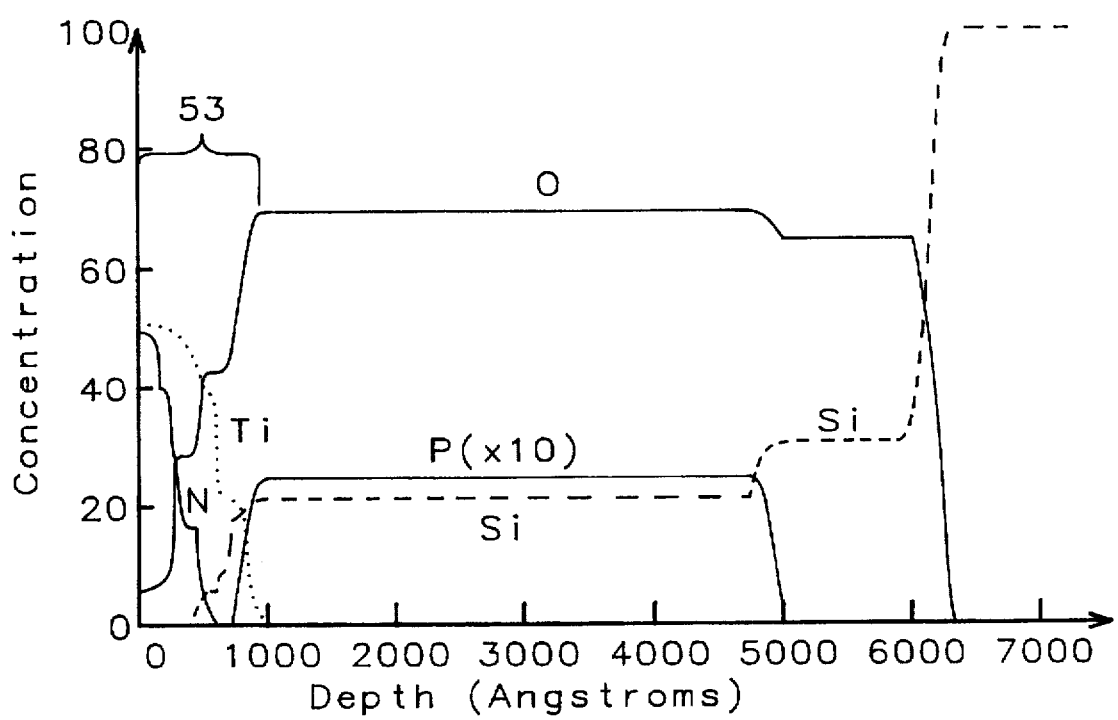
FIG. 3 graphically illustrates depth versus concentration of the elements of the barrier layer of the present invention.

Referring now to FIG. 3, there is illustrated Rutherford Backscattering Spectroscope data showing the depth versus concentration of the elements of the barrier layer for the present invention. 500 Angstroms of titanium were sputtered onto a layer of BPSG, then RTA at 600° C. for 60 seconds, then at 850° C. for 20 seconds both in $NH_3$ ambient. It can be seen that $TiSi_xO_y$, 53, is formed rather than $TiO_x$. This compound improves adhesion between the metal and dielectric and prevents the peeling problem at the bonding pads.

A temperature of about 850° C. would be expected by one skilled in the art to cause the problems of increased stress and junction leakage described above. However, it has been found and experimentally proven by the inventors that a third annealing step at between about 600° to 750° C. for between about 10 to 120 seconds serves to temper the barrier layer. This tempering step releases system stress by more than 20% and reduces junction leakage.

After the metal diffusion barrier layer 22 has been fabricated, the contacts may be completed by depositing and patterning a metal 24, such as Aluminum or an Aluminum alloy. In the bonding pad portion B of the integrated circuit, bonding pad metallization 24 does not peel away because of the improved adhesion between the barrier layer 22 and the dielectric 20. Passivation layer 26 completes the structure.

EXAMPLE

The following Example is given to show the important features of the invention and to aid in the understanding thereof. Variations may be made by one skilled in the art without departing from the spirit and scope of the invention.

The following table shows some parameters measured for two samples. Sample A was fabricated according to a prior art process in which 500 Angstroms of titanium was deposited on BPSG, then RTA at 600° C. for 60 seconds and at 750° C. for 20 seconds both in a $NH_3$ ambient. Sample B was fabricated according to the process of the present invention in which 500 Angstroms of titanium was deposited on BPSG, then RTA at 600° C. for 60 seconds, at 850° C. for 20 seconds, then at 750° C. for 20 seconds all in a $NH_3$ ambient.

TABLE 1

| Sample | A | B |
| --- | --- | --- |
| Films on BPSG | $TiN_xO_y/TiO_x/SiO_x$ | $TiN_xO_y/TiSi_xO_y/SiO_x$ |
| Aluminum Bonding | All Fail | All OK |
| Stress on Si | 4.0 E 10 dyne/cm$^2$ | 4.0 E 16 dyne/cm$^2$ |

It can be seen from the table above that Sample B, formed by the process of the present invention had no trouble with bonding adhesion as did Sample A of the prior art. The tensile stress on the silicon is the same in both samples indicating that the higher temperature of the second step of the invention did not cause an increase in system stress due to the third tempering step of the invention. A RTA process in which the recipe was 600° C. for 60 seconds, then 850° C. for 20 seconds, without the tempering step, resulted in a tensile stress of more than 4.8 E 10 dyne/cm$^2$.

While the invention has been particularly shown and described with reference to the preferred embodiments thereof, it will be understood by those skilled in the art that various changes in form and details may be made without departing from the spirit and scope of the invention.

What is claimed is:

1. The method of forming a metal diffusion barrier layer in the fabrication of an integrated circuit comprising:
   providing semiconductor device structures in and on a semiconductor substrate wherein said semiconductor device structures are covered by at least one dielectric layer;
   opening at least one contact hole through said at least one dielectric layer to said semiconductor substrate;
   depositing a single titanium layer conformally over said at least one dielectric layer and in said at least one contact hole; and
   annealing said single titanium layer with one surface of said single titanium layer in contact with said substrate surface exposed to gases in an annealing environment to form a metal diffusion barrier layer wherein said annealing comprises:
      a first annealing to transform an upper portion of said single titanium layer into titanium nitride and to form a titanium silicide compound at said semiconductor substrate surface within said at least one contact hole;
      a second annealing to form stable and adhesive titanium compounds on said at least one dielectric layer and to alter said titanium silicide compound on said semiconductor substrate surface within said at least one contact hole; and
      a third annealing to temper said titanium nitride diffusion barrier layer and said titanium silicide layer to reduce system stress;
   completing said formation of said metal barrier diffusion layer in the fabrication of said integrated circuit.

2. The method of claim 1 wherein said at least one dielectric layer is composed of borophosphosilicate glass and has a thickness of between about 3000 to 10,000 Angstroms.

3. The method of claim 1 wherein said at least one dielectric layer is composed of phosphosilicate glass and has a thickness of between about 3000 to 10,000 Angstroms.

4. The method of claim 1 wherein said at least one dielectric layer is composed of silicon oxide and has a thickness of between about 3000 to 10,000 Angstroms.

5. The method of claim 1 wherein said single titanium layer is deposited to a thickness of between about 200 to 2000 Angstroms.

6. The method of claim 1 wherein said first, second, and third annealings are performed in a $N_2$ ambient.

7. The method of claim 1 wherein said first, second, and third annealings are performed in a $NH_3$ ambient.

8. The method of claim 1 wherein said first annealing is performed at a temperature of between about 580° to 630° C. for between about 20 to 120 seconds.

9. The method of claim 1 wherein said second annealing is performed at between about 800° to 900° C. for between about 5 to 60 seconds.

10. The method of claim 1 wherein said third annealing is performed at a temperature of between about 600° to 750° C. for between about 10 to 120 seconds.

11. The method of claim 1 wherein said third annealing reduces system stress by more than 20%.

12. The method of forming a metal diffusion barrier layer in the fabrication of an integrated circuit comprising:

providing semiconductor device structures in and on a semiconductor substrate wherein said semiconductor device structures are covered by at least one dielectric layer;

opening at least one contact hole through said at least one dielectric layer to said semiconductor substrate;

depositing a layer of titanium conformally over said at least one dielectric layer and in said at least one contact hole;

depositing a layer of titanium nitride overlying said titanium layer; and annealing said titanium layer to form a metal diffusion barrier layer wherein said annealing comprises:

a first annealing at a first temperature greater than 750° C. to form stable and adhesive titanium compounds on said at least one dielectric layer and to form a titanium silicide compound on said semiconductor substrate surface within said at least one contact hole; and a second annealing at a temperature lower than said first temperature to temper said titanium nitride diffusion barrier layer and said titanium silicide layer to reduce system stress;

completing said formation of said metal barrier diffusion layer in the fabrication of said integrated circuit.

13. The method of claim 12 wherein said at least one dielectric layer is composed of borophosphosilicate glass and has a thickness of between about 3000 to 10,000 Angstroms.

14. The method of claim 12 wherein said at least one dielectric layer is composed of phosphosilicate glass and has a thickness of between about 3000 to 10,000 Angstroms.

15. The method of claim 12 wherein said at least one dielectric layer is composed of silicon oxide and has a thickness of between about 3000 to 10,000 Angstroms.

16. The method of claim 12 wherein said titanium layer is deposited to a thickness of between about 50 to 1000 Angstroms.

17. The method of claim 12 wherein said titanium nitride layer is deposited to a thickness of between about 200 to 2000 Angstroms.

18. The method of claim 12 wherein said first and second annealings are performed in a $N_2$ ambient.

19. The method of claim 12 wherein said first and second annealings are performed in a $NH_3$ ambient.

20. The method of claim 12 wherein said first annealing is performed at between about 800° to 900° C. for between about 5 to 60 seconds.

21. The method of claim 12 wherein said second annealing is performed at a temperature of between about 600° to 750° C. for between about 10 to 120 seconds.

22. The method of claim 12 wherein said second annealing reduces system stress by more than 20%.

23. The method of forming a metal diffusion barrier layer in the fabrication of an integrated circuit comprising:

providing semiconductor device structures in and on a semiconductor substrate wherein said semiconductor device structures are covered by at least one dielectric layer;

opening at least one contact hole through said at least one dielectric layer to said semiconductor substrate;

depositing a layer of titanium conformally over said at least one dielectric layer and in said at least one contact hole;

annealing said titanium layer to form a metal diffusion barrier layer wherein said annealing comprises a sequence of steps as follows:

a first annealing at a temperature of between about 580° to 630° C. for between about 20 to 120 seconds;

a second annealing at a temperature of between about 800° to 900° C. for between about 5 to 60 seconds; and a third annealing at a temperature of between about 600° to 750° C. for between about 10 to 120 seconds;

completing said formation of said metal barrier diffusion layer in the fabrication of said integrated circuit.

24. The method of claim 23 wherein said at least one dielectric layer is composed of borophosphosilicate glass and has a thickness of between about 3000 to 10,000 Angstroms.

25. The method of claim 23 wherein said at least one dielectric layer is composed of phosphosilicate glass and has a thickness of between about 3000 to 10,000 Angstroms.

26. The method of claim 23 wherein said at least one dielectric layer is composed of silicon oxide and has a thickness of between about 3000 to 10,000 Angstroms.

27. The method of claim 23 wherein said titanium layer is deposited to a thickness of between about 200 to 2000 Angstroms.

28. The method of claim 23 wherein said first, second, and third annealings are performed in a $N_2$ ambient.

29. The method of claim 23 wherein said first, second, and third annealings are performed in a $NH_3$ ambient.

30. The method of claim 23 wherein said first annealing transforms the upper portion of said titanium layer into titanium nitride.

31. The method of claim 23 wherein said second annealing forms $TiSi_xO_y$ which promotes adhesion between said at least one dielectric layer and said metal barrier diffusion layer.

32. The method of claim 23 wherein said second annealing does not form $TiO_x$ which inhibits adhesion between said at least one dielectric layer and said metal barrier diffusion layer.

33. The method of claim 23 wherein said third annealing reduces system stress by more than 20%.

34. The method of forming a metal bonding pad in the fabrication of an integrated circuit comprising:

providing semiconductor device structures in and on a semiconductor substrate in an active region wherein said at least one semiconductor device structures are covered by at least one dielectric layer and wherein said dielectric layer also is provided in a bonding region of said integrated circuit;

depositing a single titanium layer conformally over said at least one dielectric layer, said single titanium layer having an upper surface;

annealing said single titanium layer to form a metal diffusion barrier layer wherein said diffusion barrier layer has good adhesion to said at least one dielectric layer and wherein said annealing comprises:

a first annealing with said upper surface of said single titanium exposed to a gas comprising nitrogen to transform an upper portion of said single titanium layer into titanium nitride and to form a titanium silicide compound at said semiconductor substrate surface within said at least one contact hole;

a second annealing to form stable and adhesive titanium compounds on said at least one dielectric layer and to alter said titanium silicide compound on said semiconductor substrate surface within said at least one contact hole; and a third annealing to temper said titanium nitride diffusion barrier layer and said titanium silicide layer to reduce system stress; and depositing a metal layer over said diffusion barrier layer and patterning said metal layer to form said metal bonding pad.

35. The method of claim 34 wherein said single titanium layer is deposited to a thickness of between about 200 to 2000 Angstroms.

36. The method of claim 34 wherein said first, second, and third annealings are performed in a $N_2$ ambient.

37. The method of claim 34 wherein said first, second, and third annealings are performed in a $NH_3$ ambient.

38. The method of claim 34 wherein said first annealing is performed at a temperature of between about 580° to 630° C. for between about 20 to 120 seconds.

39. The method of claim 34 wherein said second annealing is performed at between about 800° to 900° C. for between about 5 to 60 seconds.

40. The method of claim 34 wherein said third annealing is performed at a temperature of between about 600° to 750° C. for between about 10 to 120 seconds.

41. The method of claim 34 wherein said third annealing reduces system stress by more than 20%.

* * * * *